(12) United States Patent
Okabe et al.

(10) Patent No.: US 9,365,770 B2
(45) Date of Patent: Jun. 14, 2016

(54) ETCHING SOLUTION FOR COPPER/MOLYBDENUM-BASED MULTILAYER THIN FILM

(75) Inventors: Satoshi Okabe, Tokyo (JP); Tomoyuki Adaniya, Tokyo (JP); Taketo Maruyama, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 103 days.

(21) Appl. No.: 14/235,290

(22) PCT Filed: Jul. 25, 2012

(86) PCT No.: PCT/JP2012/068853
§ 371 (c)(1),
(2), (4) Date: Jan. 27, 2014

(87) PCT Pub. No.: WO2013/015322
PCT Pub. Date: Jan. 31, 2013

(65) Prior Publication Data
US 2014/0162403 A1    Jun. 12, 2014

(30) Foreign Application Priority Data
Jul. 26, 2011    (JP) ................................. 2011-163198

(51) Int. Cl.
*H01L 21/465*    (2006.01)
*C09K 13/06*    (2006.01)
(Continued)

(52) U.S. Cl.
CPC . *C09K 13/06* (2013.01); *C23F 1/18* (2013.01); *C23F 1/26* (2013.01); *H01L 21/32134* (2013.01); *H01L 21/465* (2013.01);
(Continued)

(58) Field of Classification Search
None
See application file for complete search history.

(56) References Cited

U.S. PATENT DOCUMENTS

| 2002/0081847 A1 | 6/2002 | Jo et al. |
| 2004/0071879 A1* | 4/2004 | Callegari .............. C23C 16/403 427/255.28 |

(Continued)

FOREIGN PATENT DOCUMENTS

| CN | 102762770 A | 10/2012 |
| JP | 2000-297387 A | 10/2000 |

(Continued)

OTHER PUBLICATIONS

International Search Report Issued Sep. 25, 2012 in PCT/JP12/068853 Filed Jul. 25, 2012.

*Primary Examiner* — Angel Roman
(74) *Attorney, Agent, or Firm* — Oblon, McClelland, Maier & Neustadt, L.L.P.

(57) ABSTRACT

The present invention relates to an etching solution being capable of selectively etching a copper/molybdenum-based multilayer thin film with respect to a semiconductor device having an oxide semiconductor layer and a copper/molybdenum-based multilayer thin film, wherein the etching solution comprises (A) hydrogen peroxide, (B) an inorganic acid containing no fluorine atom, (C) an organic acid, (D) an amine compound having 2 to 10 carbon atoms, and having an amino group and at least one group selected from an amino group and a hydroxyl group, (E) an azole, and (F) a hydrogen peroxide stabilizer, and has a pH of 2.5 to 5, as well as an etching method using the etching solution for selectively etching a copper/molybdenum-based multilayer thin film from a semiconductor device having an oxide semiconductor layer and a copper/molybdenum-based multilayer thin film.

16 Claims, 2 Drawing Sheets

(51) Int. Cl.
*C23F 1/18* (2006.01)
*C23F 1/26* (2006.01)
*H01L 21/3213* (2006.01)
*H01L 29/45* (2006.01)
*H01L 29/786* (2006.01)
*H01L 29/66* (2006.01)

(52) U.S. Cl.
CPC ............. *H01L 29/45* (2013.01); *H01L 29/458* (2013.01); *H01L 29/66765* (2013.01); *H01L 29/66969* (2013.01); *H01L 29/7869* (2013.01)

(56) References Cited

U.S. PATENT DOCUMENTS

| | | |
|---|---|---|
| 2004/0118814 A1 | 6/2004 | Kim et al. |
| 2006/0110924 A1 | 5/2006 | Ghosh et al. |
| 2009/0315026 A1 | 12/2009 | Jeong et al. |
| 2010/0289020 A1 | 11/2010 | Yano et al. |
| 2010/0320457 A1 | 12/2010 | Matsubara et al. |
| 2010/0330738 A1 | 12/2010 | Uchiyama et al. |
| 2012/0319033 A1 | 12/2012 | Okabe et al. |
| 2013/0048904 A1 | 2/2013 | Adaniya et al. |

FOREIGN PATENT DOCUMENTS

| | | |
|---|---|---|
| JP | 2002 141666 | 5/2002 |
| JP | 2002 302780 | 10/2002 |
| JP | 2004 193620 | 7/2004 |
| JP | 2009 076601 | 4/2009 |
| JP | 2010 4000 | 1/2010 |
| JP | 2010 232486 | 10/2010 |
| JP | 2010 248547 | 11/2010 |
| WO | 2009 066750 | 5/2009 |
| WO | 2009 075281 | 6/2009 |
| WO | WO 2011/099624 A1 | 8/2011 |

* cited by examiner

ETCHING SOLUTION FOR COPPER/MOLYBDENUM-BASED MULTILAYER THIN FILM

TECHNICAL FIELD

The present invention relates to an etching solution for a copper/molybdenum-based multilayer thin film.

BACKGROUND ART

Conventionally, with respect to liquid crystal display devices, an active matrix system having a structure using a thin film transistor (TFT) in a display region constituting picture elements has been employed in many applications including television. In the TFT, generally, amorphous silicon is used as a semiconductor layer and aluminum (Al) or an aluminum alloy (Al alloy) is used as a wiring material. However, as the display is increased in the size and resolution, these materials tend to cause a problem of signal delay due to the properties including field effect mobility and wiring resistance, making it difficult to achieve uniform image display.

For removing the problems, recently, the application of a transparent oxide semiconductor to the semiconductor layer for TFT is studied. For example, a display device using an oxide semiconductor (IGZO) comprising indium (In), gallium (Ga), and zinc (Zn); an oxide semiconductor comprising zinc oxide (ZnO); or an oxide semiconductor comprising a zinc (Zn)-tin (Sn) composite oxide (ZTO), and having field effect mobility higher than that of a conventional display device has been studied and proposed (for example, patent documents 1 to 3). The oxide semiconductor material, however, is generally likely to be dissolved in an acidic or alkaline etching solution used for etching a metal which is a wiring material.

Figure 1:
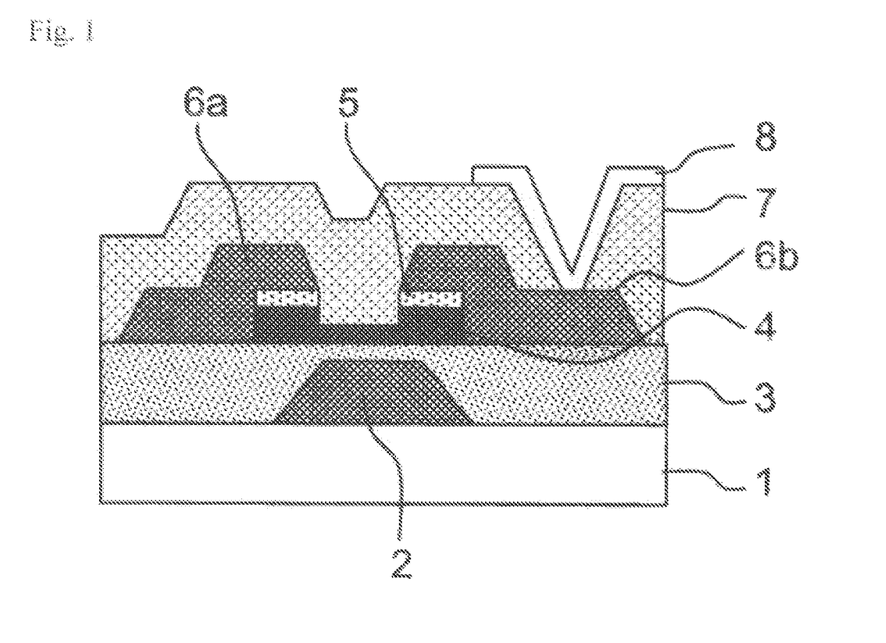
FIG. 1 is a diagrammatic view of the cross-sectional structure of a TFT using amorphous silicon in the semiconductor layer.
Figure 2:
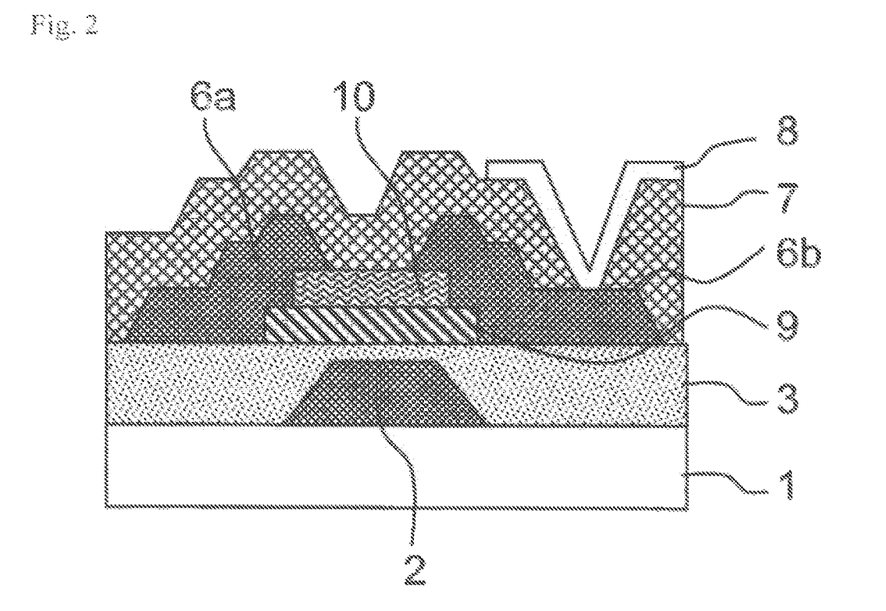
FIG. 2 is a diagrammatic view of the cross-sectional structure of an etching stopper-type TFT using IGZO in the semiconductor layer.

For example, in the case where the IGZO as a semiconductor material and aluminum or an aluminum alloy as a conventional wiring material are used in combination, the IGZO is easily etched by, e.g., an acidic solution and hence, when the IGZO semiconductor layer is in contact with an etching solution used for patterning the wiring material, the IGZO semiconductor layer is damaged, causing a change of the electric properties. For this reason, as shown in FIG. 2, for protecting the channel region between source electrode 6a and drain electrode 6b on IGZO semiconductor layer 9, etching stopper layer 10 is provided to effectively prevent IGZO semiconductor layer 9 from suffering damage.

Figure 3:
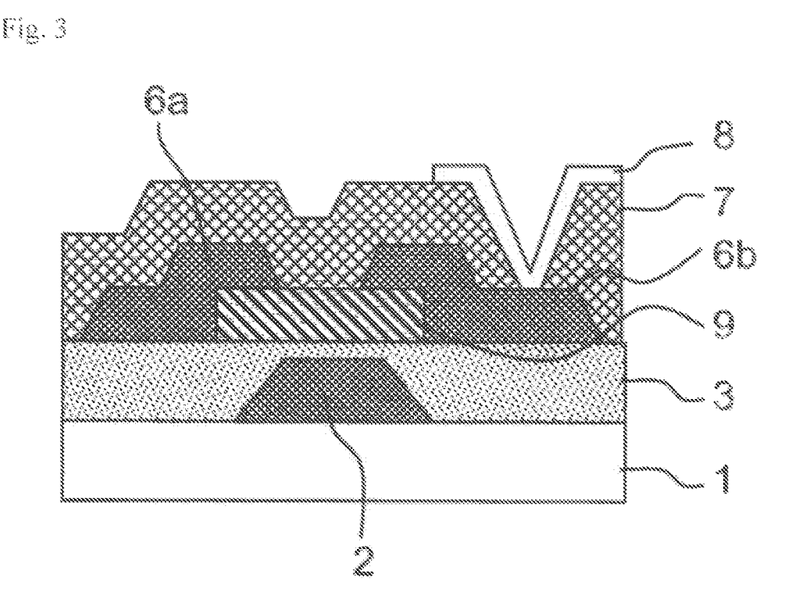
FIG. 3 is a diagrammatic view of the cross-sectional structure of a channel etching-type TFT using IGZO in the semiconductor layer.

However, such a so-called etching stopper-type TFT structure has problems in that the formation of an etching stopper layer increases the number of the steps for production, and in that the width of the channel region is limited and thus the degree of freedom for the TFT element design is considerably restricted. Therefore, a channel etching-type TFT structure shown in FIG. 3 is desirable. In addition, the aluminum and aluminum alloy as a wiring material per se have a high resistance, and therefore there is a fear that the properties of an oxide semiconductor, such as IGZO, cannot be satisfactorily utilized.

For solving the above problems, the use of a combination of the oxide semiconductor and a wiring comprised of copper (Cu) or mainly of copper, which is a material having a lower resistance, is studied. Copper has an advantage in that the resistance is low; however, copper poses problems in that when used in a gate wiring, copper has only unsatisfactory adhesion to a substrate, such as glass, and in that when used in a source-drain wiring, copper may diffuse into the underlying semiconductor layer. For preventing these problems, laminating a barrier film of a metal having high adhesion to a substrate, such as glass, and being unlikely to diffuse into a silicon semiconductor film and having barrier properties is studied, and molybdenum (Mo) has attracted attention as the metal.

The laminated film comprising copper or a copper alloy comprised mainly of copper is formed on a substrate, such as glass, by a deposition process, such as a sputtering method, and then subjected to etching process using, e.g., a resist as a mask, forming an electrode pattern. Examples of methods for the etching process include a wet etching method using an etching solution and a dry etching method using an etching gas, such as plasma. The performance required for the etching solution used in the wet etching method is that (i) the oxide semiconductor layer is unlikely to suffer damage, that (ii) the process accuracy is high, that (iii) an etching residue is unlikely to be caused, that (iv) uneven etching is unlikely to occur, that (v) the etching performance is stable despite dissolution of the metal in the wiring material containing copper to be etched (effect of extending the bath life), and that, for dealing with the increase of the display in size and resolution, (vi) the wiring cross-sectional form obtained after the etching is in a predetermined range and the wiring cross-sectional form obtained after the etching is excellent. More specifically, a normal taper form in which the angle between the etched surface at the end of the copper wiring and the underlying substrate shown in FIG. 4 (taper angle) is 30 to 60°, and a distance (CD loss) of 1.2 μm or less, preferably 1 μm or less between the resist end and the wiring end in contact with the barrier film provided under the wiring are required.

As an etching solution used in an etching process for a laminated film comprising copper or a copper alloy comprised mainly of copper, for example, an etching solution comprising at least one selected from among a neutral salt, an inorganic acid and an organic acid, hydrogen peroxide, and a hydrogen peroxide stabilizer (for example, patent document 4), and an etching solution comprising hydrogen peroxide, an organic acid, a phosphate, two types of nitrogen-containing additives, a fluoride compound, and water in predetermined amounts (for example, patent document 5) have been proposed. In addition, an etching solution composition capable of selectively etching a metal film comprising, e.g., Al or an Al alloy from a laminated film comprising an amorphous oxide film and a metal film comprising, e.g., Al or an Al alloy (for example, patent document 6) has been proposed.

However, any of the above-mentioned etching solutions cannot obtain a satisfactory wiring cross-sectional form after the etching, making it difficult to satisfactorily deal with the increase of the display in size and resolution. Further, the etching solution disclosed in patent document 5 comprises a fluoride compound and causes an oxide semiconductor layer, such as an IGZO layer, to suffer serious damage, and further is unsatisfactory from the viewpoint of protecting the environment.

PRIOR ART REFERENCES

Patent Documents

Patent document 1: International Patent Application Publication No. 2009/075281
Patent document 2: Japanese Unexamined Patent Publication No. 2010-4000
Patent document 3: Japanese Unexamined Patent Publication No. 2010-248547
Patent document 4: Japanese Unexamined Patent Publication No. 2002-302780

Patent document 5: Japanese Unexamined Patent Publication No. 2004-193620
Patent document 6: International Patent Application Publication No. 2009/066750

SUMMARY OF THE INVENTION

Problems to be Solved by the Invention

Under such a situation, the present invention has been made and an object of the present invention is to provide an etching solution for a copper/molybdenum-based multilayer thin film, which is unlikely to cause an oxide semiconductor layer, such as an IGZO layer, to suffer damage, and an etching method using the etching solution for selectively etching a copper/molybdenum-based multilayer thin film with respect to an oxide semiconductor layer.

Means to Solve the Problems

The present inventors have conducted extensive and intensive studies with a view toward achieving the above object. As a result, it has been found that the above object can be achieved by an etching solution which comprises a specific combination, i.e., (A) hydrogen peroxide, (B) an inorganic acid containing no fluorine atom, (C) an organic acid, (D) an amine compound, (E) an azole, and (F) a hydrogen peroxide stabilizer, and which has a pH in the range of from 2.5 to 5.

The present invention has been completed, based on the above finding. Specifically, the gist of the present invention is as follows.

[1] An etching solution being capable of selectively etching a copper/molybdenum-based multilayer thin film with respect to a semiconductor device having an oxide semiconductor layer and a copper/molybdenum-based multilayer thin film, wherein the etching solution comprises (A) hydrogen peroxide, (B) an inorganic acid containing no fluorine atom, (C) an organic acid, (D) an amine compound having 2 to 10 carbon atoms, and having an amino group and at least one group selected from an amino group and a hydroxyl group, (E) an azole, and (F) a hydrogen peroxide stabilizer, and has a pH of 2.5 to 5.

[2] The etching solution according to item 1 above, wherein the inorganic acid (B) is sulfuric acid and/or nitric acid.

[3] The etching solution according to item 1 or 2 above, wherein the organic acid (C) is at least one member selected from succinic acid, glycolic acid, lactic acid, malonic acid and malic acid.

[4] The etching solution according to any one of items 1 to 3 above, wherein the amine compound (D) is at least one member selected from ethanolamine, 1-amino-2-propanol and N,N-diethyl-1,3-propanediamine.

[5] The etching solution according to any one of items 1 to 4 above, wherein the azole (E) is 5-amino-1H-tetrazole.

[6] The etching solution according to any one of items 1 to 5 above, wherein the hydrogen peroxide stabilizer (F) is phenylurea.

[7] An etching solution being capable of selectively etching a copper/molybdenum-based multilayer thin film with respect to a semiconductor device having an oxide semiconductor layer and a copper/molybdenum-based multilayer thin film, wherein the etching solution comprises 3 to 10% by mass of (A) hydrogen peroxide, 0.01 to 5% by mass of (B) an inorganic acid containing no fluorine atom, 1 to 15% by mass of (C) an organic acid, 1 to 10% by mass of (D) an amine compound having 2 to 10 carbon atoms, and having an amino group and at least one group selected from an amino group and a hydroxyl group, 0.001 to 1% by mass of (E) an azole, and 0.01 to 0.5% by mass of (F) a hydrogen peroxide stabilizer, and has a pH value of 2.5 to 5.

[8] The etching solution according to any one of items 1 to 7 above, which further comprises copper ions in advance in an amount of 100 to 8,000 ppm.

[9] The etching solution according to any one of items 1 to 8 above, wherein the oxide semiconductor layer is an oxide semiconductor layer comprising at least one of indium, gallium and zinc.

[10] The etching solution according to item 9 above, wherein the oxide semiconductor layer is an oxide semiconductor (IGZO) layer comprising indium, gallium and zinc.

[11] An etching method for selectively etching a copper/molybdenum-based multilayer thin film with respect to a semiconductor device having an oxide semiconductor layer and a copper/molybdenum-based multilayer thin film, wherein the etching method comprises contacting the semiconductor device with the etching solution according to any one of items 1 to 10 above.

[12] The etching method according to item 11 above, wherein the oxide semiconductor layer is an oxide semiconductor layer comprising at least one of indium, gallium and zinc.

[13] A method for producing a semiconductor device, comprising contacting a semiconductor device having an oxide semiconductor layer and a copper/molybdenum-based multilayer thin film with the etching solution according to any one of items 1 to 10 above.

[14] The method according to item 13 above, wherein the oxide semiconductor layer is an oxide semiconductor layer comprising at least one of indium, gallium and zinc.

Effect of the Invention

In the present invention, there can be provided an etching solution which is advantageous not only in that the etching solution is unlikely to cause an oxide semiconductor layer, such as an IGZO semiconductor layer, to suffer damage in an etching process for a copper/molybdenum-based multilayer thin film, and the process accuracy after etching is high, and an etching residue or uneven etching is unlikely to be caused and thus the bath life can be extended, but also in that a wiring cross-sectional form obtained after the etching is excellent, so that the etching solution can deal with the increase of the size and resolution of a display, and an etching method for a copper/molybdenum-based multilayer thin film using the etching solution. By the etching method, a wiring having a copper/molybdenum-based multilayer thin film can be etched selectively and in one step. Further, the etching method is advantageous not only in that the formation of an etching stopper layer is not required, making it possible to achieve high productivity, but also in that a wiring cross-sectional form obtained after the etching is excellent.

MODE FOR CARRYING OUT THE INVENTION

Etching Solution for a Copper/Molybdenum-Based Multilayer Thin Film

The etching solution of the present invention is used in selectively etching a copper/molybdenum-based multilayer thin film with respect to a semiconductor device having an oxide semiconductor layer and a copper/molybdenum-based multilayer thin film, and comprises (A) hydrogen peroxide, (B) an inorganic acid containing no fluorine atom, (C) an organic acid, (D) an amine compound having 2 to 10 carbon atoms, and having an amino group and at least one group selected from an amino group and a hydroxyl group, (E) an azole, and (F) a hydrogen peroxide stabilizer, and has a pH of 2.5 to 5.

<(A) Hydrogen Peroxide>

Hydrogen peroxide used in the etching solution of the present invention functions as an oxidizing agent to oxidize copper and has a function to dissolve molybdenum by oxidizing. The content of hydrogen peroxide in the etching solution is preferably 3 to 10% by mass, more preferably 4.5 to 7.5% by mass. When the content of hydrogen peroxide falls within the above-mentioned range, not only can the control of hydrogen peroxide be easy, but also an appropriate etching rate can be secured, making it easy to control the etching rate.

<(B) Inorganic Acid Containing No Fluorine Atom>

The inorganic acid containing no fluorine atom used in the etching solution of the present invention contributes to dissolution of the copper oxidized due to hydrogen peroxide (A), and, in the present invention, an acid containing no fluorine atom is employed from the viewpoint of protecting the environment. Preferred examples of the inorganic acid containing no fluorine atom include sulfuric acid, nitric acid, hydrochloric acid, phosphoric acid, hypophosphorous acid, carbonic acid, sulfamic acid, and boric acid, and these can be used individually or in combination. Of these, preferred are sulfuric acid and nitric acid.

The content of the inorganic acid (B) in the etching solution is preferably 0.01 to 5% by mass, more preferably 0.01 to 3% by mass. When the content of the inorganic acid falls within the above-mentioned range, an appropriate etching rate can be obtained, and further a wiring cross-sectional form obtained after the etching is excellent.

<(C) Organic Acid>

The organic acid used in the etching solution of the present invention contributes to the etching of copper and molybdenum and the removal of residues derived from molybdenum. The content of the organic acid in the etching solution is preferably 1 to 15% by mass, more preferably 5 to 13% by mass. When the content of the organic acid falls within the above-mentioned range, the etching of copper and molybdenum and the removal of residues derived from molybdenum can be satisfactorily made, and further a wiring cross-sectional form obtained after the etching is excellent. Furthermore, the organic acid functions also as a masking agent for copper ions contained after the etching, making it possible to prevent hydrogen peroxide from excessively decomposing by copper.

Preferred examples of the organic acid include aliphatic carboxylic acids having 1 to 18 carbon atoms, aromatic carboxylic acids having 6 to 10 carbon atoms, and amino acids having 1 to 10 carbon atoms.

Preferred examples of aliphatic carboxylic acids having 1 to 18 carbon atoms include formic acid, acetic acid, propionic acid, lactic acid, glycolic acid, diglycolic acid, pyruvic acid, malonic acid, butyric acid, hydroxybutyric acid, tartaric acid, succinic acid, malic acid, maleic acid, fumaric acid, valeric acid, glutaric acid, itaconic acid, adipic acid, caproic acid, citric acid, propanetricarboxylic acid, trans-aconitic acid, enanthic acid, caprylic acid, lauric acid, myristic acid, palmitic acid, stearic acid, oleic acid, linoleic acid, and linolenic acid.

Preferred examples of aromatic carboxylic acids having 6 to 10 carbon atoms include benzoic acid, salicylic acid, mandelic acid, phthalic acid, isophthalic acid, and terephthalic acid.

Preferred examples of amino acids having 1 to 10 carbon atoms include carbamic acid, alanine, glycine, asparagine, aspartic acid, sarcosine, serine, glutamine, glutamic acid, 4-aminobutyric acid, iminodibutyric acid, arginine, leucine, isoleucine, and nitrilotriacetic acid.

Among the above-mentioned organic acids, preferred organic acids are acetic acid, succinic acid, alanine, citric acid, malic acid, lactic acid, glycolic acid, tartaric acid, malonic acid, glycine, glutaric acid, maleic acid, and trans-aconitic acid, and, of these, especially preferred are succinic acid, malic acid, lactic acid, glycolic acid, and malonic acid, and these can be used individually or in combination.

<(D) Amine Compound>

The amine compound used in the etching solution of the present invention contributes to excellent wiring cross-sectional form obtained after the etching, and is a compound having 2 to 10 carbon atoms, and having an amino group and at least one group selected from an amino group and a hydroxyl group.

Preferred examples of the amine compound include polyamines, such as ethylenediamine, trimethylenediamine, tetramethylenediamine, 1,2-propanediamine, 1,3-propanediamine, N,N-dimethyl-1,3-propanediamine, N,N-diethyl-1,3-propanediamine, 1,3-diaminobutane, 2,3-diaminobutane, pentamethylenediamine, 2,4-diaminopentane, hexamethylenediamine, heptamethylenediamine, octamethylenediamine, nonamethylenediamine, N-methylethylenediamine, N,N-dimethylethylenediamine, trimethylethylenediamine, N-ethylethylenediamine, N,N-diethylethylenediamine, triethylethylenediamine, 1,2,3-triaminopropane, hydrazine, tris(2-aminoethyl)amine, tetra(aminomethyl)methane, diethylenetriamine, triethylenetetramine, tetraethylenepentamine, heptaethyleneoctamine, nonaethylenedecamine, and diazabicycloundecene; and alkanol amines, such as ethanolamine, N-methylethanolamine, N-methyldiethanolamine, N-ethylethanolamine, N-aminoethylethanolamine, N-propylethanolamine, N-butylethanolamine, diethanolamine, triethanolamine, 1-amino-2-propanol, N-methylisopropanolamine, N-ethylisopropanolamine, N-propylisopropanolamine, 2-aminopropan-1-ol, N-methyl-2-aminopropan-1-ol, N-ethyl-2-aminopropan-1-ol, 1-aminopropan-3-ol, N-methyl-1-aminopropan-3-ol, N-ethyl-1-aminopropan-3-ol, 1-aminobutan-2-ol, N-methyl-1-aminobutan-2-ol, N-ethyl-1-aminobutan-2-ol, 2-aminobutan-1-ol, N-methyl-2-aminobutan-1-ol, N-ethyl-2-aminobutan-1-ol, 3-aminobutan-1-ol, N-methyl-3-aminobutan-1-ol, N-ethyl-3-aminobutan-1-ol, 1-aminobutan-4-ol, N-methyl-1-aminobutan-4-ol, N-ethyl-1-aminobutan-4-ol, 1-amino-2-methylpropan-2-ol, 2-amino-2-methylpropan-1-ol, 1-aminopentan-4-ol, 2-amino-4-methylpentan-1-ol, 2-aminohexan-1-ol, 3-aminoheptan-4-ol, 1-aminooctan-2-ol, 5-aminooctan-4-ol, 1-aminopropane-2,3-diol, 2-aminopropane-1,3-diol, tris(oxymethyl)aminomethane, 1,2-diaminopropan-3-ol, 1,3-diaminopropan-2-ol, 2-(2-aminoethoxy)ethanol, 2-(2-aminoethylamino)ethanol, and diglycolamine, and these can be used individually or in combination. Of these, especially preferred are ethanolamine, 1-amino-2-propanol, and N,N-diethyl-1,3-propanediamine.

The content of the amine compound in the etching solution of the present invention is preferably 1 to 10% by mass, more preferably 2 to 7% by mass. When the content of the amine compound falls within the above-mentioned range, a wiring cross-sectional form obtained after the etching is excellent.

<(E) Azole>

With respect to the azole used in the etching solution of the present invention, preferred examples include triazoles, such as 1H-benzotriazole, 5-methyl-1H-benzotriazole, and 3-amino-1H-triazole; tetrazoles, such as 1H-tetrazole, 5-methyl-1H-tetrazole, 5-phenyl-1H-tetrazole, and 5-amino-1H-tetrazole; imidazoles, such as 1H-imidazole and 1H-benzimidazole; and thiazoles, such as 1,3-thiazole and 4-methylthiazole. Of these, tetrazoles are preferred, and 5-amino-1H-tetrazole is especially preferred.

The content of the azole in the etching solution is preferably 0.001 to 1% by mass, more preferably 0.001 to 0.5% by mass. When the content of the azole falls within the above-mentioned range, the increase of the CD loss after the etching can be suppressed, and further a wiring cross-sectional form obtained after the etching is excellent.

<(F) Hydrogen Peroxide Stabilizer>

The etching solution of the present invention comprises a hydrogen peroxide stabilizer. With respect to the hydrogen peroxide stabilizer, any one generally used as a hydrogen peroxide stabilizer can be used without limitation, and preferred examples of the hydrogen peroxide stabilizer include urea-based hydrogen peroxide stabilizers, such as phenylurea, allylurea, 1,3-dimethylurea, and thiourea, and in addition thereto, phenylacetamide and phenylethylene glycol. Of these, preferred is phenylurea.

The content of the hydrogen peroxide stabilizer (F) in the etching solution of the present invention is preferably 0.01 to 0.5% by mass, more preferably 0.01 to 0.3% by mass from the viewpoint of obtaining a satisfactory effect aimed at by adding the stabilizer.

<pH>

It is necessary that the etching solution of the present invention have a pH of 2.5 to 5. When the pH of the etching solution is less than 2.5, molybdenum oxide formed upon etching and dissolving molybdenum is unlikely to be dissolved, so that residues derived from the molybdenum oxide are generated after the etching to cause leakage, lowering the electric properties. Further, the etching solution having such a low pH disadvantageously causes an oxide semiconductor layer, such as an IGZO layer, to suffer serious damage. On the other hand, when the pH of the etching solution is larger than 5, the stability of hydrogen peroxide (A) becomes poor, the etching rate for copper is reduced, and the bath life is reduced. From such a point of view, the etching solution of the present invention preferably has a pH of 2.5 to 5.

<Copper Ions>

It is preferred that the etching solution of the present invention comprises copper ions in advance for the purpose of improving the etching performance from the beginning of the use of the etching solution. The etching solution can comprise copper ions by adding a copper powder or a copper salt, such as copper sulfate or copper nitrate, to the etching solution.

The concentration of copper ions in the etching solution is preferably 100 ppm or more, more preferably 200 ppm or more. With respect to the upper limit of the concentration, there is no particular limitation as long as the etching performance is not lowered, but, taking the bath life and others into consideration, the upper limit of the concentration is preferably 8,000 ppm or less, further preferably 6,000 ppm or less, especially preferably 2,000 ppm or less.

<Other Components>

In addition to the above-mentioned components (A) to (F), the etching solution of the present invention may comprise water and other various additives generally used in the etching solution in such an amount that the effects of the etching solution are not sacrificed. As water, preferred is water from which, e.g., metal ions, organic impurities, or particles are removed by distillation, an ion-exchange treatment, a filter treatment, or various adsorption treatments, and pure water or ultrapure water is especially preferred. As an additive, for example, various ligands or a chelating agent having an effect of improving the stability of the etching solution upon dissolution of copper ions can be used. Further, for example, for adjusting the pH of the etching solution, a pH adjustor can be used, or for stabilizing the pH of the etching solution, a buffer can be used.

[Etching Method for a Copper/Molybdenum-Based Multilayer Thin Film]

The etching method of the present invention is an etching method for selectively etching a copper/molybdenum-based multilayer thin film with respect to a semiconductor device having an oxide semiconductor layer and a copper/molybdenum-based multilayer thin film, and uses the etching solution of the present invention, specifically, the etching solution for a copper/molybdenum-based multilayer thin film, which comprises (A) hydrogen peroxide, (B) an inorganic acid containing no fluorine atom, (C) an organic acid, (D) an amine compound having 2 to 10 carbon atoms, and having an amino group and at least one group selected from an amino group and a hydroxyl group, (E) an azole, and (F) a hydrogen peroxide stabilizer, and which has a pH of 2.5 to 5. The etching method has the step of contacting an object to be etched with the etching solution of the present invention. The etching method of the present invention is advantageous not only in that a copper/molybdenum-based multilayer thin film can be etched selectively and in one step with respect to an oxide semiconductor layer, but also in that a wiring cross-sectional form obtained after the etching is excellent.

Figure 4:
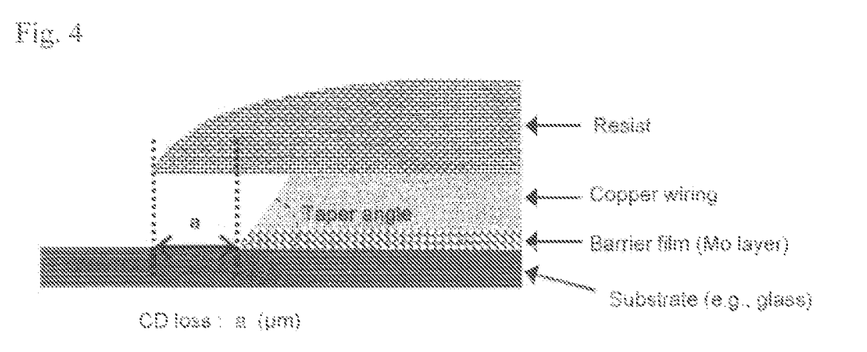
FIG. 4 is a diagrammatic view of the cross-section of a wiring having a copper/molybdenum-based multilayer thin film, which has been etched using the etching solution of the present invention.

In the etching method of the present invention, a semiconductor device having an oxide semiconductor layer, and a structure as shown in e.g., FIG. 4 is used as an object to be etched, wherein the structure is formed by stacking, on a glass substrate, a barrier film comprising a molybdenum-based material and a copper wiring film comprising copper or a material comprised mainly of copper in turn to form a copper/molybdenum multilayer thin film, and applying a resist thereto and transferring a desired patterned mask by exposure, and developing the resist to form a desired resist pattern. Also, a semiconductor device having an oxide semiconductor layer, and a so-called sandwich structure, such as a molybdenum/copper/molybdenum-based multilayer laminated film, can be used as an object to be etched, wherein the structure is formed by having molybdenum disposed onto a copper/molybdenum-based multilayer laminated film. The copper/molybdenum-based multilayer thin film is advantageously used in a wiring for, e.g., a display device, such as a flat panel display.

With respect to the copper wiring film, there is no particular limitation as long as the wiring is formed from copper or a material comprised mainly of copper (e.g., a copper alloy).

Examples of the molybdenum-based material forming the barrier film include molybdenum (Mo) metal and Mo alloys.

As examples of the oxide semiconductor layer, there can be mentioned oxides of zinc (Zn), tin (Sn), indium (In), gallium (Ga), or hafnium (Hf) and composite oxides of two or more of these metals, which have been known as an oxide semiconductor, such as ZnO, SnO, In—Ga—Zn oxide (IGZO), Zn—Sn oxide (ZTO), In—Zn oxide (IZO®), In—Hf—Zn oxide, In—Ga oxide (IGO), and In—Sn—Zn oxide (ITZO®).

With respect to the method for contacting an object to be etched with the etching solution, there is no particular limitation, and, for example, a wet etching method, such as a method of contacting an object to be etched with the etching solution by a process, such as dropwise application (single wafer spin processing) or spraying, or a method of immersing an object to be etched in the etching solution, can be employed. In the present invention, a method of contacting an object to be etched with the etching solution by a process, such as spraying, or a method of immersing an object to be etched in the etching solution to contact them is preferably employed.

The temperature at which the etching solution is used is preferably a temperature of 20 to 60° C., especially preferably 30 to 50° C. When the temperature of the etching solution is 20° C. or higher, the etching rate does not become too low, and hence the production efficiency is not remarkably lowered. On the other hand, when the temperature of the etching solution is lower than 60° C., a change of the etching solution in the composition is suppressed, making it possible to keep the etching conditions constant. The increase of the temperature of the etching solution increases the etching rate, but, taking into consideration, e.g., the suppression of a change of the etching solution in the composition, the optimum treatment temperature may be appropriately determined.

In the etching method of the present invention, hydrogen peroxide contained in the etching solution is consumed, e.g., upon oxidizing dissolution of copper or molybdenum as mentioned above, and the dissolved copper or molybdenum promotes decomposition of hydrogen peroxide, and therefore the lowering of the concentration of hydrogen peroxide in the etching solution may cause the performance of the etching solution to become poor. In such a case, by appropriately adding hydrogen peroxide (A) and organic acid (C) at the same time or separately to the etching solution, the bath life can be extended.

EXAMPLES

Hereinbelow, the present invention will be described in more detail with reference to the following Examples, which should not be construed as limiting the scope of the present invention.

(Examination of the Cross-Section of the Copper/Molybdenum-Based Multilayer Thin Film Obtained after Etching)

With respect to each of the copper/molybdenum-based multilayer thin film samples obtained in Examples and Comparative Examples, which had been subjected to etching, the cross-section of each sample was examined using a scanning electron microscope ("Model S5000 (model No.)"; manufactured by Hitachi, Ltd.) at a magnification of 30,000 times (accelerating voltage: 2 kV; accelerating current: 10 μA). From the obtained SEM image, a taper angle and a CD loss (m) shown in FIG. 4 were obtained.

The taper angle, CD loss (μm), and etching rate for the IGZO semiconductor layer falling within the respective ranges for criterion indicated in Table 1 were acceptable, and the performance of the etching solution was evaluated.

(Evaluation of the Etching Residue)

With respect to each of the copper/molybdenum-based multilayer thin film samples obtained in Examples and Comparative Examples, which had been subjected to etching, the surface of each sample was examined using a scanning electron microscope ("Model S5000 (model No.)"; manufactured by Hitachi, Ltd.) at a magnification of 50,000 times (accelerating voltage: 2 kV; accelerating current: 10 μA), and a residue on the sample was evaluated in accordance with the following criteria.

○: No residue existed.

Δ: A slight residue existed, but the wiring performance was not adversely affected and there is no problem from a practical point of view.

x: A marked residue existed.

(Evaluation of the Etching for IGZO Semiconductor Layer)

A glass substrate having an IGZO semiconductor was immersed in each of the etching solutions shown in Examples and Comparative Examples at 35° C. for 1 to 60 minutes. Thicknesses of the original oxide semiconductor layer and the oxide semiconductor layer obtained after immersed in the etching solution were measured using a fluorescent X-ray analyzer ("SEA 1200VX (model No.)"; manufactured by SII Nano Technology Inc.), and, from a difference between these thicknesses, an etching rate (Å/min.) for the oxide semiconductor was determined. The etching rate falling within the range for criterion indicated in Table 1 was acceptable, and low corrosive properties of the etching solution for the IGZO semiconductor layer were evaluated.

TABLE 1

| | | Acceptable range |
|---|---|---|
| CD loss (=a) | (μm) | 1.2 or less |
| Taper angle | (°) | 30-60 |
| Etching rate for IGZO semiconductor layer | Å/min. | 20 or less |

Preparation Example 1

Preparation of a Copper/Molybdenum-Based Multilayer Thin Film

Molybdenum (Mo) was sputtered on a glass substrate to form a barrier film comprised of molybdenum. Then, copper was sputtered on the barrier film to form a copper wiring film. Then, a resist was applied to the wiring, and a patterned mask was transferred thereto by exposure, followed by development, to prepare a copper/molybdenum-based multilayer thin film having a pattern formed thereon. A molybdenum/copper/molybdenum three-layer film was prepared by substantially the same method as mentioned above except that, before applying a resist, molybdenum was sputtered on the copper wiring film to form a molybdenum layer.

Examples 1 to 5

Etching Solution Compositions and Results of Evaluation

Copper powder was dissolved in each of the etching solutions shown in Table 2 so that the copper ion concentration (frequently referred to as "Cu concentration") became in a low-concentration range (200 to 1,000 ppm; which is frequently referred to as "Cu low-concentration range") or a high-concentration range (3,000 to 4,000 ppm; which is frequently referred to as "Cu high-concentration range"). Using the resultant etching solution, the copper/molybdenum-based multilayer thin film obtained in Preparation Example was subjected to etching at 35° C. by shower spraying, and, with respect to the copper/molybdenum-based multilayer thin film sample obtained after the etching, a taper angle and a CD loss (μm) were obtained by examination using an SEM.

Further, a time at which the object to be etched in the area having a non-patterned resist was judged to be etched by visual examination was determined as a just etching time. A period of time during which the etching treatment was continued from the just etching time in an arbitrary ratio in the range of from 40 to 100% (over etching) was determined as an etching time. (For example, when the just etching time is 100 seconds, an etching time for 50% over etching is 150 seconds.) The etching solution compositions and the results of the evaluation are shown in Table 2.

TABLE 2

| | | | Example | | | | |
|---|---|---|---|---|---|---|---|
| | | | 1 | 2 | 3 | 4 | 5 |
| Etching solution | | | 1 | 2 | 3 | 4 | 5 |
| (A) | Hydrogen peroxide*[1] | (mass %) | 5.8 | 5.8 | 5.8 | 5.8 | 4.5 |
| (B) | Nitric acid*[2] | (mass %) | 0.07 | 0.07 | 0.07 | 1.63 | 0.05 |
| (C) | Succinic acid*[2] | (mass %) | 3.0 | 3.0 | 3.0 | 3.0 | 3.0 |
| | Glycolic acid*[2] | (mass %) | 2.0 | 2.0 | 2.0 | 2.0 | 2.0 |
| | Lactic acid*[2] | (mass %) | 1.0 | 1.0 | — | 1.0 | 1.0 |
| | Malonic acid*[2] | (mass %) | 2.0 | 3.0 | 3.5 | 0.5 | 2.0 |
| | Malic acid*[2] | (mass %) | 2.0 | — | — | — | 2.0 |
| (D) | 1-Amino-2-propanol*[2] | (mass %) | — | 2.8 | 2.8 | — | — |
| | N,N-Diethyl-1,3-propanediamine*[2] | (mass %) | 4.0 | — | — | 4.9 | 5.5 |
| (E) | Azole*[3] | (mass %) | 0.05 | 0.05 | 0.1 | 0.003 | 0.025 |
| (F) | Hydrogen peroxide stabilizer*[4] | (mass %) | 0.1 | 0.1 | 0.1 | 0.1 | 0.1 |
| Water | | (mass %) | Remainder | Remainder | Remainder | Remainder | Remainder |
| pH | | | 3.5 | 3.0 | 3.0 | 3.9 | 4.0 |
| Cu thickness/Mo thickness | | Å/Å | 3000/300 | 3000/300 | 3000/300 | 5000/200 | 3000/300 |
| Cu concentration during evaluation (Low-concentration range/high-concentration range) | | ppm | 1000/4000 | 1000/4000 | 1000/4000 | 1000/4000 | 500/3000 |
| Just etching time (Cu low-concentration range/Cu high-concentration range) | | sec | 83/65 | 63/61 | 62/70 | 82/86 | 98/85 |
| Etching time | | sec | 126 | 110 | 110 | 120 | 147 |
| Taper angle (Cu low-concentration range/Cu high-concentration range) | | degree | 35/50 | 30/40 | 30/40 | 40/30 | 35/50 |
| CD loss (Cu low-concentration range/Cu high-concentration range) | | μm | 0.75/0.79 | 1.0/0.84 | 0.82/0.64 | 0.92/0.92 | 0.82/0.74 |
| General evaluation of wiring cross-sectional form | | | ○ | ○ | ○ | ○ | ○ |
| Evaluation of residue (Cu low-concentration range/Cu high-concentration range) | | | ○/○ | ○/○ | ○/○ | ○/○ | ○/○ |

*[1]Manufactured by Mitsubishi Gas Chemical Company, Inc.

*[2]Manufactured by Wako Pure Chemical Industries, Ltd.

*[3]5-Amino-1H-tetrazole, manufactured by Wako Pure Chemical Industries, Ltd.

*[4]Phenylurea, manufactured by Wako Pure Chemical Industries, Ltd.

Examples 6 and 7

Etching was performed in substantially the same manner as in Example 4 except that copper powder was added in advance to the etching solution 4 used in Example 4 so that the copper ion concentration became 200 ppm (Example 6) or 6,000 ppm (Example 7). With respect to each of the copper/molybdenum-based multilayer thin films obtained after the etching, a taper angle, a CD loss (μm), and the evaluation of residue are shown in Table 3. Further, Table 3 also shows the taper angle, CD loss (μm), and evaluation of residue with respect to the copper/molybdenum-based multilayer thin film obtained after the etching using the etching solution 4 in Example 4 (to which copper powder was not added in advance).

TABLE 3

|  |  | Example |  |  |
|---|---|---|---|---|
|  |  | 4 | 6 | 7 |
| Copper ion concentration | ppm | 0 | 200 | 6000 |
| Cu thickness/Mo thickness | Å/Å | 5000/200 | 5000/200 | 5000/200 |
| Just etching time | sec | 80 | 80 | 101 |
| Etching time | sec | 120 | 120 | 120 |
| Taper angle | degree | 35 | 40 | 30 |
| CD loss | μm | 1.0 | 1.0 | 0.65 |
| General evaluation of wiring cross-sectional form |  | ○ | ○ | ○ |
| Evaluation of residue |  | Δ | ○ | ○ |
| Evaluation of crystal deposition |  | ○ | ○ | ○ |

Etching operations for Examples 8 and 9 were individually performed in substantially the same manner as in Example 4 except that copper powder was added in advance to the etching solution 4 used in Example 4 so that the copper concentration became the respective concentrations shown in Table 4, and that the film to be etched was changed to a molybdenum/copper/molybdenum three-layer film. In Example 8, the etching temperature was 32° C. With respect to each of the obtained molybdenum/copper/molybdenum multilayer thin films, a taper angle, a CD loss (μm), and the evaluation of residue are shown in Table 4.

TABLE 4

|  |  | Example | |
|---|---|---|---|
|  |  | 8 | 9 |
| Etching solution |  | 4 | 4 |
| Mo thickness/Cu thickness/Mo thickness | Å/Å | 100/5000/200 | 500/3000/200 |
| Cu concentration during evaluation (Low-concentration range/high-concentration range) | ppm | 500/3000 | 2000 |
| Etching temperature | ° C. | 32 | 35 |
| Just etching time (Cu low-concentration range/Cu high-concentration range) | sec | 100/105 | 83 |
| Etching time | sec | 145 | 125 |
| Taper angle (Cu low-concentration range/Cu high-concentration range) | degree | 30/30 | 40 |
| CD loss (Cu low-concentration range/Cu high-concentration range) | μm | 1.0/0.89 | 1.0 |
| General evaluation of wiring cross-sectional form |  | ○ | ○ |
| Evaluation of residue (Cu low-concentration range/Cu high-concentration range) |  | ○/○ | ○ |

Comparative Examples 1 to 5

Etching was performed in substantially the same manner as in Example 1 except that the etching solutions having the compositions shown in Table 5 were individually used. With respect to each of the obtained copper/molybdenum-based multilayer thin films, a taper angle, a CD loss (μm), and the evaluation of residue are shown in Table 5.

In Examples using the etching solution of the present invention, the wiring cross-sectional form obtained after the etching was excellent, and further excellent results were obtained in the evaluation of residue. In contrast, in Comparative Example 1 using the etching solution comprising no component (B), with respect to the wiring cross-sectional form, the molybdenum lower layer was selectively etched as compared to the copper upper layer, namely, a so-called

TABLE 5

| | | | Comparative example | | | | | |
|---|---|---|---|---|---|---|---|---|
| | | | 1 | 2 | 3 | 4 | 5 | 6 |
| Etching solution | | | 6 | 7 | 8 | 9 | 10 | 11 |
| (A) | Hydrogen peroxide*¹ | (mass %) | 5.8 | 6.0 | 6.0 | 5.8 | 5.8 | 1.5 |
| (B) | Nitric acid*² | (mass %) | — | — | — | 0.07 | 0.07 | — |
| (C) | Succinic acid*² | (mass %) | 3.0 | — | — | 3.0 | 3.0 | — |
| | Glycolic acid*² | (mass %) | 2.0 | — | — | 2.0 | 2.0 | — |
| | Lactic acid*² | (mass %) | — | — | — | 1.0 | 1.0 | — |
| | Malonic acid*² | (mass %) | 2.0 | — | — | 3.0 | 3.0 | — |
| | Malic acid*² | (mass %) | 2.0 | — | — | — | — | — |
| (D) | N,N-Diethyl-1,3-propanediamine*² | (mass %) | 3.6 | — | — | — | — | — |
| | 1-Amino-2-propanol*² | (mass %) | — | — | — | 2.8 | — | — |
| (E) | Azole*³ | (mass %) | 0.05 | — | — | 0.05 | 0.05 | — |
| (F) | Hydrogen peroxide stabilizer*⁴ | (mass %) | 0.1 | — | — | 0.1 | 0.1 | — |
| Ammonia | | (mass %) | — | — | — | — | 1.0 | 7.0 |
| Sodium chloride | | (mass %) | — | 5.0 | — | — | — | — |
| Potassium hydrogensulfate | | (mass %) | — | — | 5.0 | — | — | — |
| Water | | (mass %) | Remainder | Remainder | Remainder | Remainder | Remainder | — |
| pH | | | 3.5 | 4.9 | 0.9 | 1.5 | 3.5 | 11.3 |
| Cu thickness/Mo thickness | | Å/Å | 3000/300 | 3000/300 | 3000/300 | 3000/300 | 3000/300 | 5000/200 |
| Cu concentration during evaluation (Low-concentration range/high-concentration range) | | ppm | 500/4000 | 0 | 0 | 1000/4000 | 1000/4000 | 0 |
| Just etching time (Cu low-concentration range/Cu high-concentration range) | | sec | 84/83 | 180 sec or more | 98 | 52/55 | 51/63 | 150 |
| Etching time | | sec | 126 | — | 150 | 130 | 130 | 225 |
| Taper angle (Cu low-concentration range/Cu high-concentration range) | | degree | 35/40 | — | — | 25/28 | Reverse tapered | — |
| CD loss (Cu low-concentration range/Cu high-concentration range) | | μm | 0.64/0.60 | — | — | 1.72/1.18 | 1.57/1.0 | — |
| General evaluation of wiring cross-sectional form | | | X*⁵ | X*⁶ | X*⁷ | X | X | X*⁷ |
| Evaluation of residue (Cu low-concentration range/Cu high-concentration range) | | | Δ/○ | — | — | Δ/○ | ○/○ | — |

*⁵In the wiring cross-sectional form within a Cu high-concentration range, the molybdenum lower layer was selectively etched as compared to the copper upper layer, namely, an undercut was caused.
*⁶Not etched.
*⁷The resist was peeled off.

With respect to the compositions in Examples 1 to 5 and Comparative Examples 1 to 6, etching rates for the IGZO semiconductor layer obtained in accordance with the method for determining an etching rate for the IGZO semiconductor layer are shown in Table 6.

TABLE 6

| | | Example | | | | |
|---|---|---|---|---|---|---|
| | | 1 | 2 | 3 | 4 | 5 |
| Cu concentration during evaluation | ppm | 1000 | 1000 | 1000 | 1000 | 1000 |
| Etching rate for IGZO semiconductor layer | Å/min. | 6 | 16 | 18 | 8 | 11 |

| | | Comparative example | | | | | |
|---|---|---|---|---|---|---|---|
| | | 1 | 2 | 3 | 4 | 5 | 6 |
| Cu concentration during evaluation | ppm | 500 | 0 | 0 | 1000 | 1000 | 0 |
| Etching rate for IGZO semiconductor layer | Å/min. | 6 | <1 | 340 | 27 | 14 | 35 | undercut was caused. In Comparative Examples 2 and 3 using the etching solution which does not comprise components (B) to (F), it was found that the etching did not proceed or the resist was peeled off, and these etching solutions were not able to be practically used. Further, in Comparative Example 4 using the etching solution having a pH falling outside the range defined in the present invention, it was found that the CD loss was larger than 1. In Comparative Example 5 using the etching solution comprising no component (D), it was found that the molybdenum lower layer was selectively etched, and the etched face was not normal-tapered but reverse-tapered and partially had a taper angle of more than 90 degrees, causing a problem about the wiring cross-sectional form.

In Examples 6 and 7 using the etching solution comprising copper ions in advance in an amount of 200 ppm or 6,000 ppm, it was found that the wiring cross-sectional form obtained after the etching was more excellent than the wiring cross-sectional form obtained after the etching in Example 4 (using the etching solution to which copper powder was not added in advance), and the evaluation of residue was also excellent. That is, the results have confirmed that when copper ions are added in advance to the etching solution of the present invention, the etching solution exhibits excellent performance from the beginning of the use of the etching solution.

Further, in each of Examples 1 to 5, the etching rate for the IGZO falls within the acceptable range, which confirms that both excellent etching rate for the IGZO and excellent etching performance for the copper/molybdenum-based multilayer thin film are achieved.

INDUSTRIAL APPLICABILITY

The etching solution of the present invention can be advantageously used in etching a copper/molybdenum-based multilayer thin film without causing an oxide semiconductor layer, such as an IGZO layer, to suffer substantial damage. The etching method using the above etching solution is advantageous not only in that a wiring having a copper/molybdenum-based multilayer thin film can be etched selectively and in one step with respect to an oxide semiconductor layer, such as an IGZO layer, but also in that a wiring cross-sectional form obtained after the etching is excellent, making it possible to achieve high productivity.

DESCRIPTION OF REFERENCE NUMERALS

1: Glass
2: Gate electrode
3: Gate insulating film
4: i layer (Amorphous silicon)
5: n+ layer (Amorphous silicon)
6a: Source electrode
6b: Drain electrode
7: Protective layer
8: Transparent electrode
9: IGZO semiconductor layer
10: Etching stopper layer

The invention claimed is:
1. An etching solution, comprising:
(A) hydrogen peroxide;
(B) an inorganic acid comprising no fluorine atom;
(C) an organic acid;
(D) an amine compound having 2 to 10 carbon atoms, and comprising a first amino group and at least one selected from the group consisting of a second amino group and a hydroxyl group;
(E) an azole; and
(F) a hydrogen peroxide stabilizer,
wherein the etching solution has a pH of 2.5 to 5.

2. The etching solution according to claim 1, wherein the inorganic acid (B) is at least one of sulfuric acid and nitric acid.

3. The etching solution according to claim 1, wherein the organic acid (C) is at least one selected from the group consisting of succinic acid, glycolic acid, lactic acid, malonic acid and malic acid.

4. The etching solution according to claim 1, wherein the amine compound (D) is at least one selected from the group consisting of ethanolamine, 1-amino-2-propanol and N,N-diethyl-1,3-propanediamine.

5. The etching solution according to claim 1, wherein the azole (E) is 5-amino-1H-tetrazole.

6. The etching solution according to claim 1, wherein the hydrogen peroxide stabilizer (F) is phenylurea.

7. The etching solution of claim 1, comprising:
(A) 3 to 10% by mass of the hydrogen peroxide (A);
(B) 0.01 to 5% by mass of the inorganic acid (B) containing no fluorine atom;
(C) 1 to 15% by mass of the organic acid (C);
(D) 1 to 10% by mass of the amine compound (D);
(E) 0.001 to 1% by mass of the azole (E); and
(F) 0.01 to 0.5% by mass of the hydrogen peroxide stabilizer.

8. The etching solution according to claim 1, further comprising copper ions in an amount of 100 to 8,000 ppm.

9. An etching method for selectively etching a copper/molybdenum-based multilayer thin film of a semiconductor device comprising an oxide semiconductor layer and the copper/molybdenum-based multilayer thin film, the etching method comprising;
contacting the semiconductor device with an etching solution, comprising:
(A) hydrogen peroxide;
(B) an inorganic acid comprising no fluorine atom;
(C) an organic acid;
(D) an amine compound having 2 to 10 carbon atoms, and comprising a first amino group and at least one selected from the group consisting of a second amino group and a hydroxyl group;
(E) an azole; and
(F) a hydrogen peroxide stabilizer;
wherein the etching solution has a pH of 2.5 to 5.

10. The etching method according to claim 9, wherein the oxide semiconductor layer is an oxide semiconductor layer comprising at least one of indium, gallium and zinc.

11. A method for producing a semiconductor device, the method comprising:
contacting a semiconductor device comprising an oxide semiconductor layer and a copper/molybdenum-based multilayer thin film with an etching solution, comprising:
(A) hydrogen peroxide;
(B) an inorganic acid comprising no fluorine atom;
(C) an organic acid;
(D) an amine compound having 2 to 10 carbon atoms, and comprising a first amino group and at least one selected from the group consisting of a second amino group and a hydroxyl group;
(E) an azole; and
(F) a hydrogen peroxide stabilizer;
wherein the etching solution has a pH of 2.5 to 5.

12. The method according to claim 11, wherein the oxide semiconductor layer is an oxide semiconductor layer comprising at least one of indium, gallium and zinc.

13. The etching solution of claim 1, which can selectively etch a copper/molybdenum-based multilayer thin film with respect to a semiconductor device comprising an oxide semiconductor layer and the copper/molybdenum-based multilayer thin film.

14. The etching solution of claim 7, which can selectively etch a copper/molybdenum-based multilayer thin film with respect to a semiconductor device comprising an oxide semiconductor layer and the copper/molybdenum-based multilayer thin film.

15. The etching solution according to claim 13, wherein the oxide semiconductor layer is an oxide semiconductor layer comprising at least one of indium, gallium and zinc.

16. The etching solution according to claim 15, wherein the oxide semiconductor layer is an oxide semiconductor (IGZO) layer comprising indium, gallium and zinc.

* * * * *